United States Patent [19]

Nogle

[11] Patent Number: 5,475,635
[45] Date of Patent: Dec. 12, 1995

[54] MEMORY WITH A COMBINED GLOBAL DATA LINE LOAD AND MULTIPLEXER

[75] Inventor: Scott G. Nogle, Austin, Tex.

[73] Assignee: Motorola, Inc., Schaumburg, Ill.

[21] Appl. No.: 218,450

[22] Filed: Mar. 28, 1994

Related U.S. Application Data

[63] Continuation of Ser. No. 836,549, Feb. 18, 1992, abandoned, which is a continuation of Ser. No. 590,980, Oct. 1, 1990, abandoned.

[51] Int. Cl.⁶ .......................... G11C 7/00; G11C 11/419
[52] U.S. Cl. .................. 365/189.02; 365/177; 365/190; 365/208; 365/230.03; 365/230.06
[58] Field of Search .................... 365/155, 156, 365/177, 179, 189.02, 190, 230.02, 230.03, 207, 208, 230.06

[56] References Cited

U.S. PATENT DOCUMENTS

| | | | |
|---|---|---|---|
| 4,314,359 | 2/1982 | Kato et al. | 365/155 |
| 4,663,741 | 5/1987 | Reinschmidt et al. | 365/155 |
| 4,866,674 | 9/1989 | Tran | 365/189.1 |
| 4,928,268 | 5/1990 | Nogle et al. | 365/230 |
| 4,984,196 | 1/1991 | Tran et al. | 365/177 |
| 5,043,945 | 8/1991 | Bader | 365/190 |

FOREIGN PATENT DOCUMENTS

| | | | |
|---|---|---|---|
| 0034791 | 2/1988 | Japan | 365/177 |

OTHER PUBLICATIONS

Matsui, et al, "High–Speed SRAMs", 1989 IEEE Solid State Circuits Conference, pp. 38–39.
Tran et al, "An 8ns BiCMOS 1Mb ECL SRAM with a Configurable Memory Array Size", 1898 IEEE Solid State Circuit Conference, pp. 36–37.
Kertis et al, "A 12ns 256K BiCMOS SRAM", 1989 IEEE Solid State Circuits Conference, pp. 186–187.
Burnett and Hu, "Hot–Carrier Degradation in Bipolar Transistors at 300 and 110 K–Effect on BiCl Inverter Performance"< IEEE Transactions on Electron Devices, vol. 37, No. 4, Apr. 1990, p. 11.

*Primary Examiner*—Jack A. Lane
*Attorney, Agent, or Firm*—Paul J. Polansky

[57] ABSTRACT

A combined global data line load and multiplexer comprises a decoder, a bias generator circuit, at least one output signal line pair, and a plurality of switching portions. The decoder provides a plurality of select signals in response to a portion of an address, each select signal provided at either a logic high voltage or at a logic low voltage. For example, a X4 memory internally organized X8 uses one extra address bit to select between two sets of four global data line pairs to provide as outputs. The bias generator circuit provides a bias signal at a voltage between the logic high and the logic low voltages. The output signal lines are each coupled through a respective resistor to a power supply voltage terminal. Each switching portion provides substantially a differential current between corresponding global data lines to corresponding output signal lines in response to the bias voltage exceeding a voltage of a corresponding select signal.

11 Claims, 6 Drawing Sheets

MEMORY WITH A COMBINED GLOBAL DATA LINE LOAD AND MULTIPLEXER

This application is a continuation of prior application Ser. No. 07/836,549, filed Feb. 18, 1992, now abandoned, which is a continuation of prior application Ser. No. 07/590,980, filed Oct. 1, 1990, abandoned.

CROSS-REFERENCE TO RELATED, COPENDING APPLICATION

Related copending application is application Ser. No. 07/577,375, now U.S. Pat. No. 5,229,967, filed Sep. 4, 1990, by Scott G. Nogle and assigned to the assignee hereof and entitled "A BICMOS Sense Circuit For Sensing Data During a Read Cycle of a Memory".

FIELD OF THE INVENTION

This invention relates generally to integrated circuit memories, and more particularly, to memories which have a resistive data output line to which a large number of outputs are coupled.

BACKGROUND OF THE INVENTION

In a typical integrated circuit memory, memory cells are located at intersections of word lines and bit line pairs. A row decoder activates one word line, and memory cells located on the activated word line provide their contents to corresponding bit line pairs. Then column decoding selects at least one bit line pair. A selected memory cell is located at an intersection of an activated word line and a selected bit line pair. During a read cycle, a selected bit line pair is coupled to a data line pair. A sense amplifier detects the contents of the selected memory cell on the data line pair and provides it to global data line pairs as a differential current. A global data line load converts the differential current into a differential voltage and provides the differential voltage to an output buffer for subsequent output.

During the read cycle, the memory couples a given number of bit line pairs, based on row and column decoding, onto corresponding global data line pairs. The given number determines, in part, the organization of the memory. For example, a memory which provides the contents of eight memory cells onto global data line pairs and subsequently outputs the values on the eight global data line pairs has a by-eight (X8) organization. In many commercial applications, however, different organizations are required. For example, applications may require by-four (X4) or by-one (X1) organizations. In order for the memory to provide these different organizations without requiring significant redesign, one or more additional address signals are used to further decode the memory cells selected by row and column decoding. This function is referred to as multiplexing. After multiplexing, the data signals are provided externally to the memory.

Static random access memories designed as integrated circuits require increasingly shorter access times to stay commercially competitive. Shorter access times present difficulties, however. In the case of a memory with a given organization which is adapted to provide a different organization through a multiplexer, the multiplexer significantly delays development of the global data line voltages and increases access time of the memory.

SUMMARY OF THE INVENTION

Accordingly, there is provided, in one form, a combined global data line load and multiplexer comprising decoding means, bias means, at least one output signal line pair, and a plurality of switching means. The decoding means provides a plurality of select signals in response to a portion of an address, each select signal provided at either a logic high voltage or a logic low voltage. The bias means provides a bias signal at a voltage between the logic high and the logic low voltages. First and second output signal lines of each output signal line pair are respectively coupled through first and second resistors to a power supply voltage terminal. Each switching means is coupled to first and second output signal lines of a corresponding output signal line pair and to a corresponding global data line pair, and provides a differential current between first and second output signal lines of the corresponding output signal line pair substantially equal to a differential current between first and second global data lines of the global data line pair in response to the bias voltage exceeding a voltage of a corresponding select signal.

These and other objects, features and advantages will be more clearly understood from the following detailed description taken in conjunction with the accompanying drawings.

DETAILED DESCRIPTION OF THE INVENTION

Figure 1:
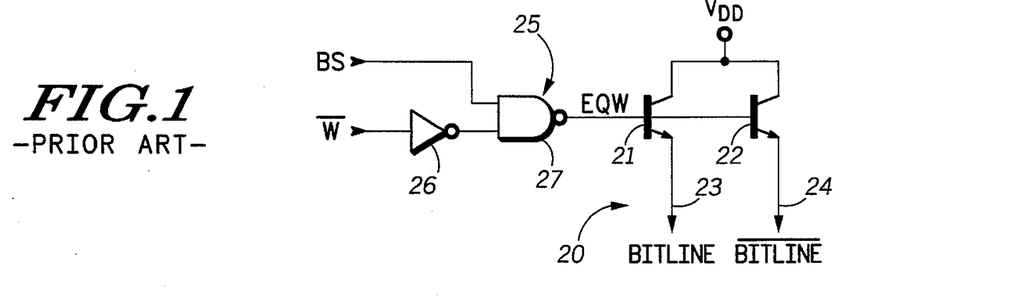
FIG. 1 illustrates in partial schematic form a bit line load in accordance with the prior art and a control circuit therefor.

FIG. 1 illustrates in partial schematic form a bit line load 20 in accordance with the prior art, and control circuit 25 therefor. See, for example, "Bitline Pull-Up Circuit for a BICMOS Read/Write Memory" by Tran in U.S. Pat. No. 4,866,674, issued Sep. 12, 1989; Kertis et. al., "A 12ns 256K BiCMOS SRAM", in 1989 *IEEE Solid State Circuits Conference*, p. 187. Bit line load 20 comprises an NPN transistor 21 having a collector connected to a positive power supply voltage terminal labelled "$V_{DD}$", a base for receiving a signal labelled "EQW", and an emitter coupled to a bit line 23 having a signal labelled "BITLINE" thereon; and an NPN transistor 22 having a collector connected to $V_{DD}$, a base for receiving signal EQW, and an emitter coupled to a bit line 24 having a signal labelled "$\overline{\text{BITLINE}}$" thereon. Control circuit 25 comprises an inverter 26 having an input terminal for receiving a write signal labelled "$\overline{W}$", and an output terminal; and a NAND gate 27 having a first input terminal for receiving a block select signal labelled "BS", a second input terminal connected to the output terminal of inverter 26, and an output terminal for providing EQW.

Signal EQW causes transistors 21 and 22 to precharge bit lines 23 and 24. EQW is asserted in response to either signal BS being negated as a logic low, or signal $\overline{W}$ being negated as a logic high. A write recovery period occurs between a time at which either BS or $\overline{W}$ is negated, until voltages on bitlines 23 and 24 are substantially equal. EQW is negated in response to both signals BS and $\overline{W}$ being asserted, indicating a write access to the memory block in which bit line load 20 is located. When EQW is asserted, transistors 21 and 22 increase the voltage on the corresponding bit line, bit line 23 or bit line 24 respectively, to a base-to-emitter threshold voltage ($V_{BE}$) below EQW. Also typically an MOS transistor, coupled between bit line 23 and bit line 24 (not shown in FIG. 1), is made conductive to equalize the voltage therebetween. Because bit line load 20 uses bipolar transistors 21 and 22, the speed of precharging of the voltage on the bit lines after the termination of the write cycle is improved over the use of CMOS transistors.

There is a problem with bit line load 20, however. During the write recovery period, bit line load 20 provides a voltage on bit lines 23 and 24 equal to approximately (EQW–$V_{BE}$). However, during a write cycle EQW is negated to a logic low. NAND gate 27, typically implemented using CMOS transistors, provides EQW at a logic low voltage very close to the negative power supply voltage, designated "$V_{SS}$", typically at zero volts. Hence, a large reverse bias is developed between the emitter and the base of either transistor 21 or transistor 22. If the maximum reverse bias is designated "$V_{RBMAX}$", then $$V_{RBMAX} = EQW - V_{BE} - V_{SS} \quad (1)$$

If EQW is equal to 5 volts, $V_{BE}$ is equal to 0.7 volts, and $V_{SS}$ is equal to 0 volts, $V_{RBMAX}$ would equal 4.3 volts. Over time, the constant application of this large reverse bias may cause transistor 21 or transistor 22 to fail, resulting in a failure of the entire memory. Electronically, a large reverse bias on a PN junction causes hot carrier injection into the overlying oxide, resulting in poor junction performance. See, for example, "Hot-Carrier Degradation in Bipolar Transistors at 300 and 110 K—Effect on BiCMOS Inverter Performance", by Burnett and Hu in *IEEE Transactions on Electron Devices*, vol. 37, no. 4, April 1990, pp. 1171–1173. The amount of hot carrier injection is proportional to the time the reverse bias occurs. The size of $V_{RBMAX}$ is related to the mean life of the transistor, for given worst case conditions, by an inverse semilogarithmic relationship; as $V_{RBMAX}$ decreases linearly, mean life increases exponentially. At a $V_{RBMAX}$ of 4.3 volts, transistor mean life of bit line load 20 is unacceptably short.

Figure 2:
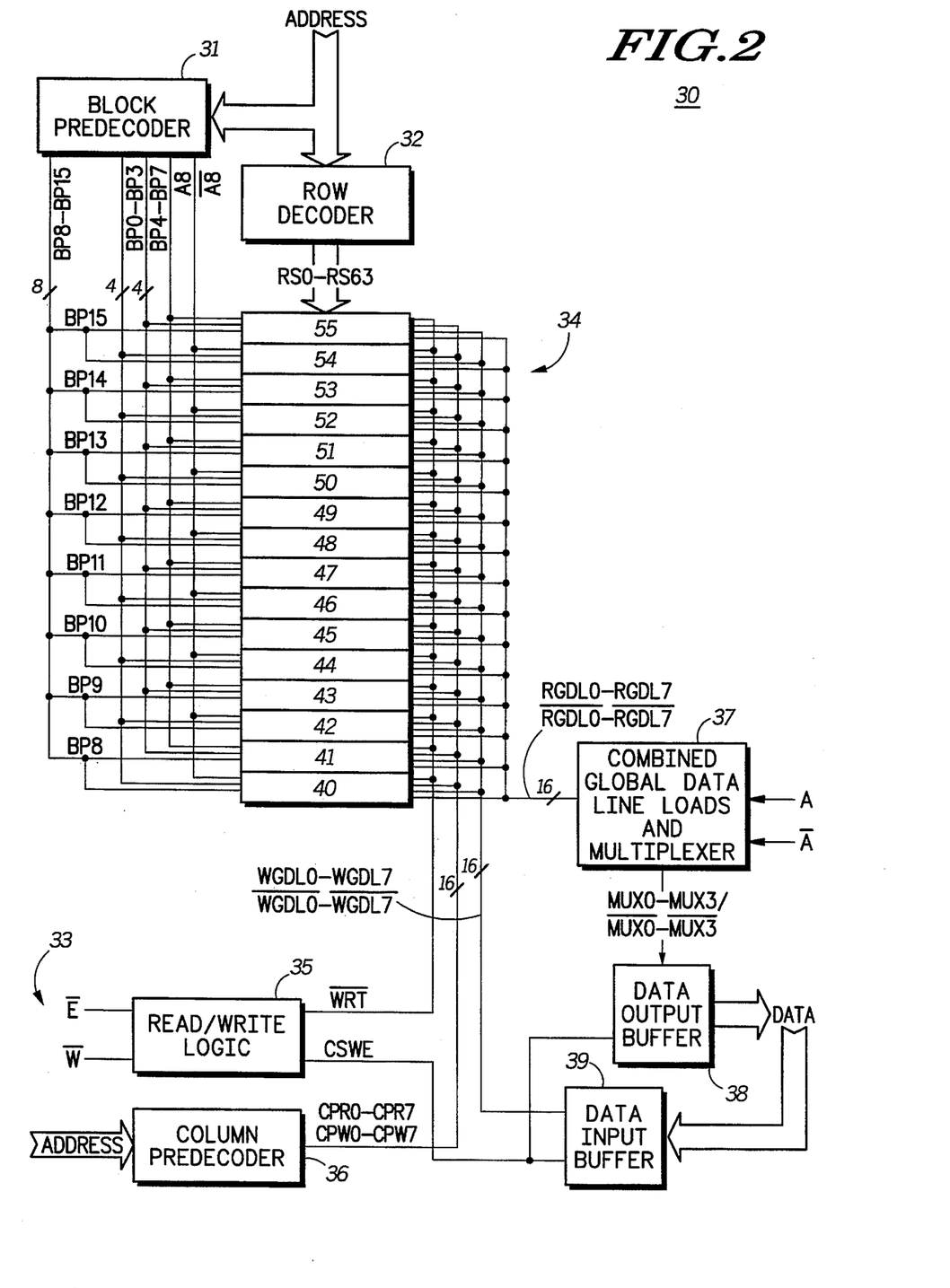
FIG. 2 illustrates in block form a memory incorporating the present invention.

FIG. 2 illustrates in block form a memory 30 incorporating the present invention. FIG. 2 shows features pertinent to understanding the present invention, but omits other features. Memory 30 comprises generally a block predecoder 31, a row decoder 32, an input/output portion 33, and a memory block portion 34. Input/output portion 33 comprises a read/write logic block 35, a column predecoder 36, a combined global data line loads and multiplexer portion 37, a data output buffer 38, a data input buffer 39, and a decoder 56. Memory block portion 34 comprises a plurality of memory blocks; in the illustrated embodiment, memory block portion 34 comprises sixteen memory blocks 40–55.

Block predecoder 31 receives a first portion of an address comprising a plurality of address signals labelled "ADDRESS" and provides predecoded block signals labelled "A8", "$\overline{A8}$", "BP0–BP3", "BP4–BP7", and "BP8–BP15" in response. A particular memory block receives a unique combination of predecoded block signals which determines when the block is selected. Even-numbered memory blocks receive $\overline{A8}$, whereas odd-numbered blocks receive A8; memory blocks 40 and 41, 42 and 43, 44 and 45, 46 and 47, 48 and 49, 50 and 51, 52 and 53, and 54 and 55 respectively receive signals BP8, BP9, BP10, BP11, BP12, BP13, BP14, and BP15. Even-numbered memory blocks receive BP0–BP3, whereas odd-numbered memory blocks receive BP4–BP7, for further decoding. Row decoder 32 receives a second portion of ADDRESS and provides row select signals labelled "RS0–RS63" in response. RS0–RS63 are provided to each memory block.

Read/write logic block 35 receives as inputs an enable signal labelled "$\overline{E}$", and a write signal labelled "$\overline{W}$". Read/write logic block 35 provides a write signal labelled "$\overline{WRT}$" to each of memory blocks 40–55, and a control signal labelled "CSWE" to data output buffer 38 and data input buffer 39 in response. $\overline{WRT}$ is a buffered signal indicating a write cycle is in progress. CSWE is a signal indicating that either a read cycle or a write cycle is in progress. Column predecoder 36 receives a third portion of ADDRESS and provides a plurality of predecoded column signals labelled "CPR0–CPR7" and "CPW0–CPW7" in response. Combined global data line loads and multiplexer 37 receive buffered address signals labelled "A" and "$\overline{A}$" and couple to each of 8 differential global data line pairs labelled "RGDL0–RGDL7" and "$\overline{RGDL0}$–$\overline{RGDL7}$". Note that the buffering of address signals A and $\overline{A}$ is not shown in FIG. 2. Combined global data line loads and multiplexer 37 provide output signals labelled "MUX0–MUX3" and "$\overline{MUX0}$–$\overline{MUX3}$" in response. Data output buffer 38 couples to MUX0–MUX3 and $\overline{MUX0}$–$\overline{MUX3}$ and provides one or more data signals labelled "DATA" in response. The number of signals in DATA corresponds to the number of output signal pairs provided by combined global data line loads and multiplexer 37. Here there are four output signal pairs provided by combined global data line loads and multiplexer 37, and thus four output signals provided on DATA. Hence the organization of memory 30 is X4. The number of data bits provided by memory 30 may vary in different embodiments so the number of data signals in DATA is left indeterminate to illustrate this. Data input buffer 39 receives DATA and provides 8 write data line signal pairs labelled "WGDL0–WGDL7" and "$\overline{WGDL0}$–$\overline{WGD7}$" in response. Note that since memory 30 is X4, data input buffer 39 will only provide four signal pairs of the group WGDL0–WGDL7 and $\overline{WGDL0}$–$\overline{WGDL7}$. The multiplexing of these signals is not shown in FIG. 2.

FIG. 2 is useful in understanding the operation of a memory in which the present invention operates. Memory 30 is capable of performing read and write cycles. Memory 30 is organized as 16 blocks, with each block organized as 256 rows and 64 columns. A function which can be considered row decoding uses the first portion of the address to enable one block and to enable one local word line in the block. Thus, row decoding decodes one of 4096 local word lines in memory 30. The row decoding function encompasses block predecoder 31 and row decoder 32. A local word line is enabled in an enabled memory block in response to RS0–RS63 and a plurality of predecoded block signals received from block predecoder 31. Column decoding decodes eight bit line pairs out of 64 bit line pairs on the enabled local word line. Row redundancy is also possible but is not shown in FIG. 2. Multiplexing is performed by a single address bit and its complement, A and $\overline{A}$. The input address comprises ADDRESS plus the extra address bit A. Since the organization of memory 30, and the portions of the input address used for particular decoding, may be altered in different embodiments, ADDRESS, A, and $\overline{A}$ are designated generically.

In the read cycle, signal $\overline{E}$ is asserted and signal $\overline{W}$ is negated. Read/write logic block 35 keeps signals $\overline{WRT}$ and CSWE negated. Block predecoder 31 selectively asserts signals A8, $\overline{A8}$, and BP0–BP15 in response to the first portion of ADDRESS. Row decoder 32 selectively asserts a row select signal of RS0–RS63 in response to the second portion of ADDRESS. The memory block selected by the predecoded signals A8, $\overline{A8}$, and a corresponding signal from the group BP8–BP15, then uses the remaining predecoded signals BP0–BP7, along with an active row select signal of RS0–RS63, to activate one local word line. Then within the selected block, each memory cell on the activated local word line provides its contents onto a corresponding differential bit line pair. Further column decoding among the bit line pairs is performed using CPR0–CPR7. The type of cycle in progress determines which signal is asserted, either one of CPR0–CPR7 for a read cycle, or one of CPW0–CPW7 for a write cycle. During the read cycle, one signal of CPR0–CPR7 is asserted to select one of eight bit line pairs in a selected memory block to output on a corresponding global data line pair. Thus, CPR0–CPR7 decode 8 of 64 bit lines. Eventually, eight bit line pairs are selected. A selected memory cell thus is located at an intersection of an enabled local word line and a selected bit line pair, in an enabled memory block.

The differential voltage on each of the eight selected bit line pairs is received and sensed by combined global data line loads and multiplexer 37. Two functions are performed: first, the output of the memory blocks, a differential current, is converted into a differential voltage. Second, four of eight global data line signals are multiplexed, based on $\overline{SEL0}$ and $\overline{SEL1}$, and provided as signals MUX0–MUX3 and $\overline{MUX0}$–$\overline{MUX3}$. The data bits represented differentially as MUX0–MUX3 and $\overline{MUX0}$–$\overline{MUX3}$ are then provided externally to memory 30 by data output buffer 38.

In the write cycle, the flow of data is essentially reversed. Data input buffer 39 receives DATA and provides four data bits differentially onto corresponding write global data line pairs in response. As noted earlier, multiplexing of DATA as an input during the write cycle is not shown in FIG. 2. Since memory 30 is organized to store or provide four data bits of memory per access, DATA is provided on four pairs of the eight differential write global data line pairs WGDL0–WGDL7 and $\overline{WGDL0}$–$\overline{WGDL7}$. Signals CPW0–CPW7 from column predecoder 36 are used in a selected memory block to perform column decoding to couple the four write global data lines to four bit line pairs. During the write cycle, one signal of CPW0–CPW7 is asserted to select one of eight bit line pairs in a selected memory block to output on a corresponding global data line pair. Thus, CPW0–CPW7 decode 8 of 64 bit lines. The local word line decoding occurs in the same manner as for the read cycle. The differential voltage developed on the bit line pairs is much larger for the write cycle than for the read cycle in order to overwrite the contents of the selected memory cells.

Figure 3:
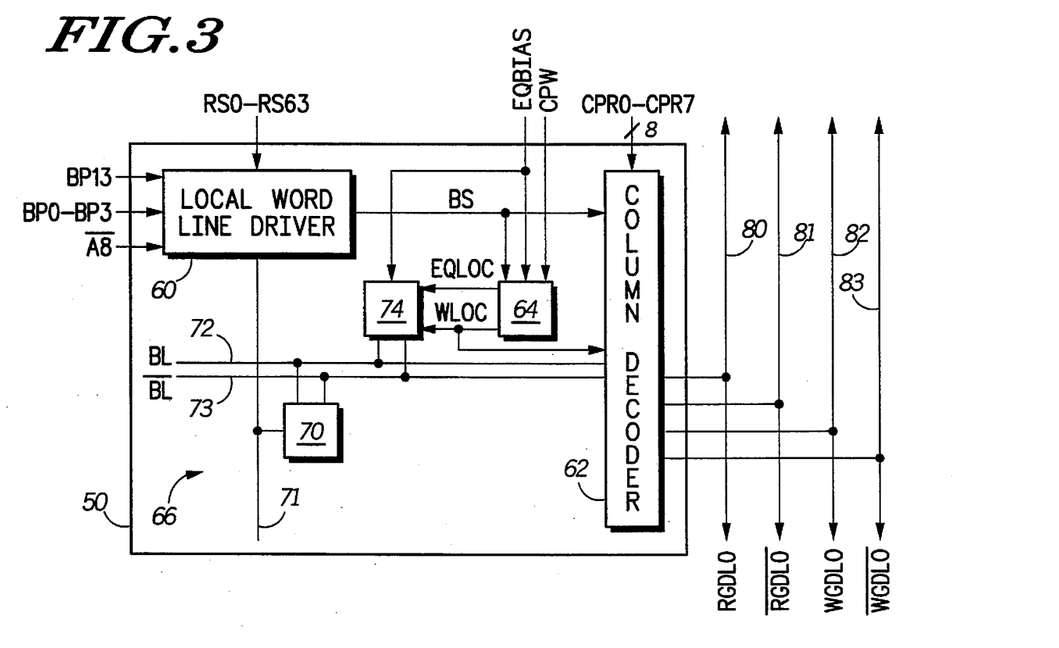
FIG. 3 shows a block diagram of a portion of a memory block of the memory of FIG. 2.
Figure 10:
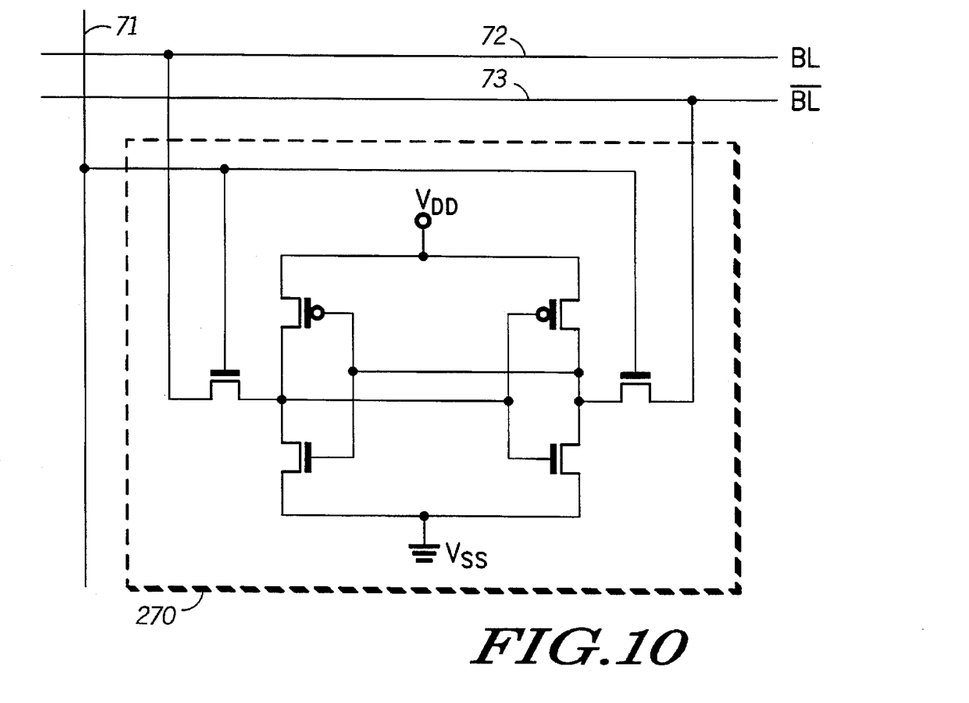
FIG. 10 illustrates in schematic form a memory cell using field effect transistors which may be used as the memory cell of FIG. 3.

FIG. 3 illustrates in block form a portion of memory block 50 of memory 30 of FIG. 2. Memory block 50 comprises a local word line driver block 60, a column decoder 62, a control signal generator circuit 64, and a memory array 66. Local word line driver block 60 provides 256 local word line signals, including a representative local word line 71, in response to input row select signals RS0–RS63, block signals BP0–BP3 and BP13, and $\overline{A8}$. In addition, it provides a block select signal labelled "BS" in response to BP13 and $\overline{A8}$. Memory array 66 comprises a plurality of memory cells at each intersection of a local word line and a bit line pair. In FIG. 3, a representative memory cell 70 is located at an intersection of local word line 71 and a bit line pair comprising a bit line 72 providing a signal labelled "BL" thereon, and a bit line 73 providing a signal labelled "$\overline{BL}$" thereon. Memory cell 70 uses field effect transistors. FIG. 10 illustrates in schematic form a memory cell 270 using field effect transistors which may be used as memory cell 70. Bit lines 72 and 73 are coupled to column decoder 62. Column decoder 62 also receives a signal labelled "WLOC" and BS. WLOC is a signal of a group of signals labelled "WLOC0–WLOC7", not shown in FIG. 3, corresponding to the column address of memory cells on bit lines 72 and 73; it is designated generically to emphasize this fact. Coupled to bit lines 72 and 73 is bit line load 74, which receives as inputs EQBIAS, EQLOC, and WLOC. Control circuit 64 receives signals EQBIAS and CPW to provide signals EQLOC and WLOC. CPW is a signal of the group CPW0–CPW7, received by memory block 50, corresponding to the column address of memory cells on bit lines 72 and 73; it is designated generically to emphasize this fact. Other control circuits receive other corresponding predecoded column signals of the group CPW0–CPW7. Column decoder 62 receives eight signals CPR0–CPR7 and couples to each bit line pair in memory array 66, and couples to eight read global data line pairs (not all shown in FIG. 3). Shown in FIG. 3 is a read global data line pair comprising a first read global data line 80 providing RGDL0 thereon, and a second read global data line 81 providing $\overline{RGDL0}$ thereon, coupled to the output of column decoder 62; and a write global data line pair comprising a first write global data line 82 providing WGDL0 thereon, and a second write global data line 83 providing $\overline{WGDL0}$ thereon, coupled to an input of column decoder 62.

In operation, memory block 50 is selected by the assertion of predecoded signals $\overline{A8}$ and BP13. When $\overline{A8}$ and BP13 are asserted, local word line driver 60 asserts signal BS to activate selected bit line loads and to activate column decoding performed by column decoder 62. When memory block 50 is selected, local word line driver block 60 provides one of 256 word lines in response to RS0–RS63 and eight additional predecoded block signals BP0–BP7. In the read cycle, if memory block 50 is selected and local word line driver block 60 asserts local word line 71, then memory cell 70 couples a data bit stored therein differentially onto bit lines 72 and 73. Bit line load 74 provides an active pull up on bit lines 72 and 73. If a binary 1 is stored in memory cell 70, then a positive differential voltage is developed between BL and $\overline{BL}$. If a binary 0 is stored in memory cell 70, then a negative differential voltage is developed between BL and $\overline{BL}$. In either case, transistors in memory cell 70 have gate sizes sufficiently large to reduce a voltage provided by bit line load 74 enough so that a differential voltage may be recognized by column decoder 62. Column decoder 62 then decodes one pair of bit lines for each read global data line pair. Each selected bit line pair is coupled to a corresponding read global data line pair, and information stored in the corresponding selected memory cell is sensed and provided as a differential current onto the corresponding read global data line.

In the write cycle, data is provided differentially from eight write global data line pairs to corresponding selected memory cells. While the decoding occurs as in the read cycle, data is received by column decoder 62 during the write cycle from write global data lines 82 and 83 providing signals WGDL0 and $\overline{\text{WGDL0}}$ thereon. A principal difference between the read cycle and the write cycle is that during the read cycle a small differential voltage is developed on the bit line pair, but during the write cycle a large differential voltage is developed on the bit line pair by column decoder 62. While the voltage developed on the bit line pair during the write cycle must be large enough to overwrite a bit stored in a corresponding memory cell, the bit line load must precharge and equalize the voltage on the bit lines sufficiently after a write cycle to avoid disturbing a following read cycle.

Figure 4:
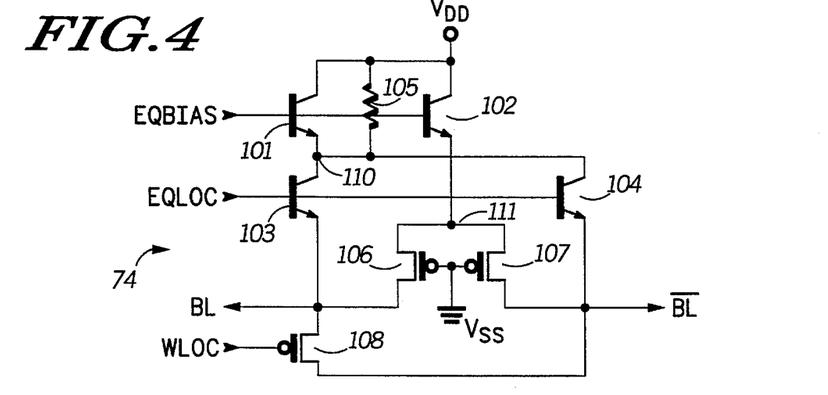
FIG. 4 illustrates in schematic form a bit line load and common voltage driver circuit shown in the memory block of FIG. 3.

FIG. 4 illustrates in schematic form bit line load 74 for use in memory 30, and NPN transistors 101 and 102 and resistor 105 used to bias bit line load 74. Bit line load 74 comprises NPN transistors 103, and 104; a resistor 105; and P-channel transistors 106, 107, and 108. Transistor 101 has a collector connected to $V_{DD}$, a base for receiving signal EQBIAS, and an emitter connected to a node 110. Transistor 102 has a collector connected to $V_{DD}$, a base for receiving signal EQBIAS, and an emitter connected to a node 111. Transistor 103 has a collector connected to node 110, a base for receiving signal EQLOC, and an emitter connected to bit line 72. Transistor 104 has a collector connected to node 110, a base for receiving signal EQLOC, and an emitter connected to bit line 73. Resistor 105 has a first terminal connected to $V_{DD}$, and a second terminal connected to node 110. Transistor 106 has a source connected to node 111, a gate connected to $V_{SS}$, and a drain connected to bit line 72. Transistor 107 has a source connected to node 111, a gate connected to $V_{SS}$, and a drain connected to bit line 73. Transistor 108 has a first current electrode connected to bit line 72, a gate for receiving signal WLOC, and a second current electrode connected to bit line 73. Which current electrode of transistor 108 functions as a source and which current electrode functions as a drain depends on the respective voltages on bit lines 72 and 73.

In basic operation, bit line load 74 serves two functions. First, bit line load 74 provides an active pull-up on both bit lines 72 and 73 for proper development of voltages BL and $\overline{\text{BL}}$ during the read cycle. During the read cycle, transistors 103 and 104 provide voltages on bit lines 72 and 73 in response to a differential current therefrom. In addition, transistors 106 and 107, which are always conductive, weakly pull up bit lines 72 and 73. Transistor 108 is also conductive during the read cycle to limit a differential voltage to a small amount, the small amount being just large enough to sense. Second, bit line load 74 equalizes and precharges the voltages on bit lines 72 and 73 during the write recovery period. Write recovery occurs during the transition from a write cycle to a read cycle. The precharging is accomplished by transistors 103 and 104 providing predetermined voltages on bit lines 72 and 73, and the equalization is accomplished by transistor 108 coupling together bit lines 72 and 73. The action of transistors 103, 104, and 108 ensures that voltages on bit lines 72 and 73 are substantially equal at the end of the write recovery period. Bit line load 74 provides an improvement over bit line load 20 of FIG. 1 because a worst-case reverse bias on bipolar transistors 103 and 104 is limited to a predetermined voltage, the predetermined voltage ensuring an acceptable mean life for the transistors under worst case conditions.

Specifically, transistor 101 provides a voltage on node 110 at one base-to-emitter diode voltage drop ($V_{BE}$) below the voltage on the signal EQBIAS, or (EQBIAS–$V_{BE}$). Similarly, transistor 102 provides a voltage on node 110 at a voltage equal to (EQBIAS–$V_{BE}$). Note that base-to-emitter diode voltage drop $V_{BE}$ is assumed to be equal for all transistors. In reality, bipolar transistor emitter size determines in part the $V_{BE}$ of a transistor; however, minor variations in $V_{BE}$ of the various transistors does not affect the invention. EQBIAS is set somewhat less than $V_{DD}$, and are made substantially independent of fluctuations in $V_{DD}$. If $V_{DD}$ is approximately 5 volts, EQBIAS may be set to approximately 4.2 volts. If the $V_{BE}$ of transistor 101 is 0.7 volts, then the voltage on node 110 is equal to approximately 3.5 volts.

During the write recovery period, transistors 103 and 104 increase the voltage on bit lines 72 and 73 to (EQLOC–$V_{BE}$). Signal EQLOC is provided at approximately EQBIAS during the read cycle. EQLOC is negated at a logic low of approximately two $V_{BE}$s above $V_{SS}$, about 1.4 volts, when a corresponding memory block is selected during the write cycle, and is asserted at a logic high of approximately EQBIAS, at about 4.2 volts, otherwise. The maximum reverse bias voltage ($V_{RBMAX}$) on transistors 103 and 104 occurs during a write cycle:

$$V_{RBMAX}=BL(\text{HIGH})-EQLOC(\text{LOW}) \qquad (2)$$

or approximately 3.5–1.4=2.1 volts. If $V_{BE}$ is equal to 0.7 volts and $V_{SS}$ is equal to 0 volts, $V_{RBMAX}$ would equal approximately 2.1 volts, which is significantly less than that of prior art bit line load 20 of FIG. 1.

The voltage supplied by transistor 101 and resistor 105 on node 110 may be shared between several bit line loads; similarly the voltage provided by transistor 102 on node 111 may be shared between several bit line loads. Thus, bit line load 74 is an equivalent representation of the bit line load circuit and does not represent all components unique to each bit line load. In the preferred embodiment, node 110 is shared by 64 bit line loads; the voltage on node 110 is provided by eight identical circuits within block 50 each having components corresponding to transistor 101 and resistor 105. The voltage on node 111 is shared between all sixteen memory blocks 40–55 of FIG. 2, with each memory block providing an identical circuit, the circuit comprising a transistor corresponding to transistor 102 having an emitter connected to node 111.

The combination of transistor 101 and resistor 105 to provide the voltage on node 110 has certain desired effects for the prevention of self-boosting. Self-boosting occurs when the voltage on the base of a bipolar transistor increases rapidly, where the emitter is coupled to a highly capacitive load. The base-emitter PN junction has an associated junction capacitance; when the voltage on the base is suddenly increased, a large base-emitter voltage is developed (since the highly capacitively load resists a sudden increase in voltage). The capacitance of a PN junction increases greatly when the $V_{BE}$ exceeds one diode voltage drop. Therefore, the base-emitter junction capacitance boosts the level of the base as the voltage at the emitter rises. Self-boosting can be stopped by reducing the charge on the base. One way to reduce the charge on the base is to cause the transistor to go into saturation, by forward biasing the base-collector diode.

Transistor 101 and resistor 105 decrease the effect of self-boosting on the bases of transistors 103 and 104 by decreasing the voltage on the collectors of transistors 103 and 104 when a large collector current flows (during write recovery). Resistor 105 causes the voltage on node 110 to be at $V_{DD}$ when substantially no current flows, which occurs when EQLOC is at a logic low. In actuality a small reverse saturation current flows but if resistor 105 is sized correctly this current can be ignored. When EQLOC switches to a logic high, either transistor 103 or 104 becomes initially active because its base-emitter junction is forward biased into a bit line at a low voltage, and its base-collector junction is reverse biased. A collector current is provided flowing into node 110. With an appreciable current, the voltage on node 110 begins to drop due to the IR drop in resistor 105. However, transistor 101 keeps the voltage on node 110 from dropping below (EQBIAS–$V_{BE}$). When the base voltage of transistor 103 or transistor 104 rises by one diode voltage drop above (EQBIAS–$V_{BE}$) the excess base charge is discharged through the base-collector diode, and self-boosting is stopped. As the collector current of transistor 103 decreases, resistor 105 increases the voltage on the collector of transistor 103 to bring transistor 103 out of saturation.

Referring again to FIG. 3, two sources of reverse bias on base-to-emitter junctions of transistors 103 and 104 of FIG. 4 may be identified. First, as previously discussed, a reverse bias may be formed during a write cycle. The voltage on bit lines 72 and 73 is (EQLOC–$V_{BE}$) when precharging is complete. During a write cycle, EQLOC is provided as a logic low voltage. Thus, a difference between a logic high voltage and a logic low voltage on EQLOC must be limited to a predetermined number to assure an acceptable transistor life under worst case conditions. Second, during the write cycle, data input buffer 39 of FIG. 2 provides a data bit to be stored differentially onto a write global data line pair. Column decoder 62 then uses predecoded column signals WLOC0–WLOC7 to couple the write global data line pairs to selected bit line pairs. To ensure that the worst case base-to-emitter reverse bias is less than the predetermined number established by EQLOC, data input buffer 39 of FIG. 2 limits a logic high voltage on a write global data line, for example WGDL0 or $\overline{WGDL0}$, to (EQLOC–$V_{BE}$). Note that column decoder 62 may decrease this voltage slightly when coupling the write global data lines to the bit line pairs.

Figure 5:
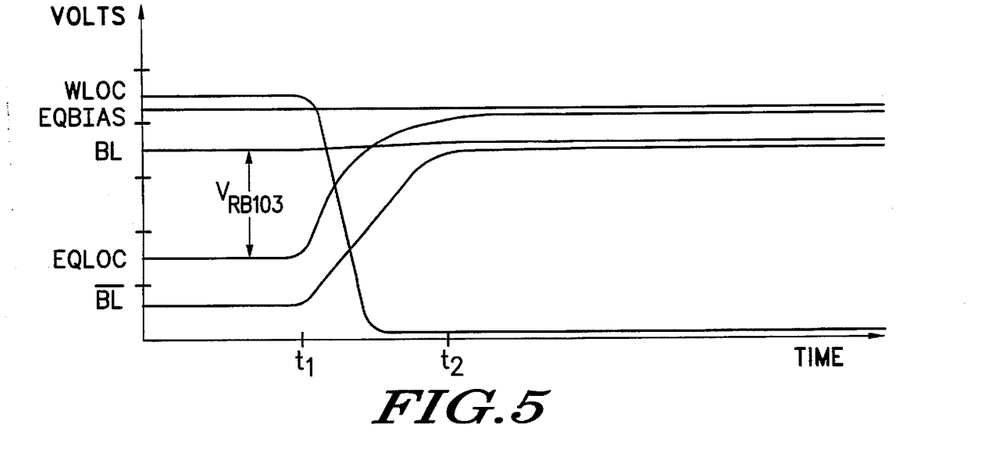
FIG. 5 illustrates a timing diagram of signals pertinent to FIG. 4.

Typical waveforms of control signals EQLOC and WLOC and other pertinent signals are shown in FIG. 5. The signals represented are WLOC, EQBIAS, BL, $\overline{BL}$, and EQLOC. FIG. 5 shows the variation in voltage of each of the pertinent signals with respect to time. A point in time labelled "t1" along the horizontal axis represents approximately a time division between a write cycle and a read cycle. Before time t1, the write cycle is in progress; between t1 and a time labelled "t2" is the write recovery period. EQBIAS is constant at approximately 4.2 volts. During the write cycle, a voltage is developed between BL and $\overline{BL}$. As previously noted, the voltage on BL and $\overline{BL}$ is provided by data input buffer 39 of FIG. 2 onto write global data lines which are coupled by column decoder 62 of FIG. 3 to selected bit line pairs. In the illustrated example a binary 1 is being provided as a positive differential voltage between BL and $\overline{BL}$. BL is at approximately 3.5 volts, while $\overline{BL}$ is approximately one $V_{BE}$ above $V_{SS}$, or about 0.7 volts. Therefore, there is a differential voltage of about 2.8 volts which is sufficient to ensure a fast transfer of data when the contents of a selected memory cell are overwritten during the write cycle. EQLOC is at ($V_{SS}+2V_{BE}$), or about 1.4 volts. When the write recovery period begins, EQLOC begins to rise at t1. As EQLOC rises, $\overline{BL}$ also rises. At the same time, WLOC is negated, which makes transistor 108 of FIG. 4 conductive, coupling bit lines 72 and 73 together. The voltage on $\overline{BL}$ rises until, at a time labelled "t2", it approximately equals the voltage on BL. The maximum reverse bias, labelled "$V_{RB103}$", occurs in this case on transistor 103. In the illustrated embodiment, $V_{RB103}$ is 3.5–1.4=2.1 volts. $V_{RB103}$ is therefore much less than the $V_{RBMAX}$ of 4.3 volts associated with prior art bit line load 20 of FIG. 1. The logic high and logic low voltages chosen for EQLOC, the source voltages of transistors 106 and 107 (shown in FIG. 4), and the voltages provided by data input buffer 39 (shown in FIG. 2) which are eventually coupled to corresponding bit lines, assure a worst case reverse bias of approximately 2.1 volts to guarantee a mean transistor lifetime of at least 10 years under worst case conditions. The logic high and logic low voltages for EQLOC also assure a fast transfer of data during the write cycle. The worst case conditions occur when a given memory cell is continually written to, at maximum specified voltage for $V_{DD}$, and at minimum specified temperature. Note that other transistor lifetimes may be assured by choosing smaller worst-case reverse-bias voltages.

Figure 6:
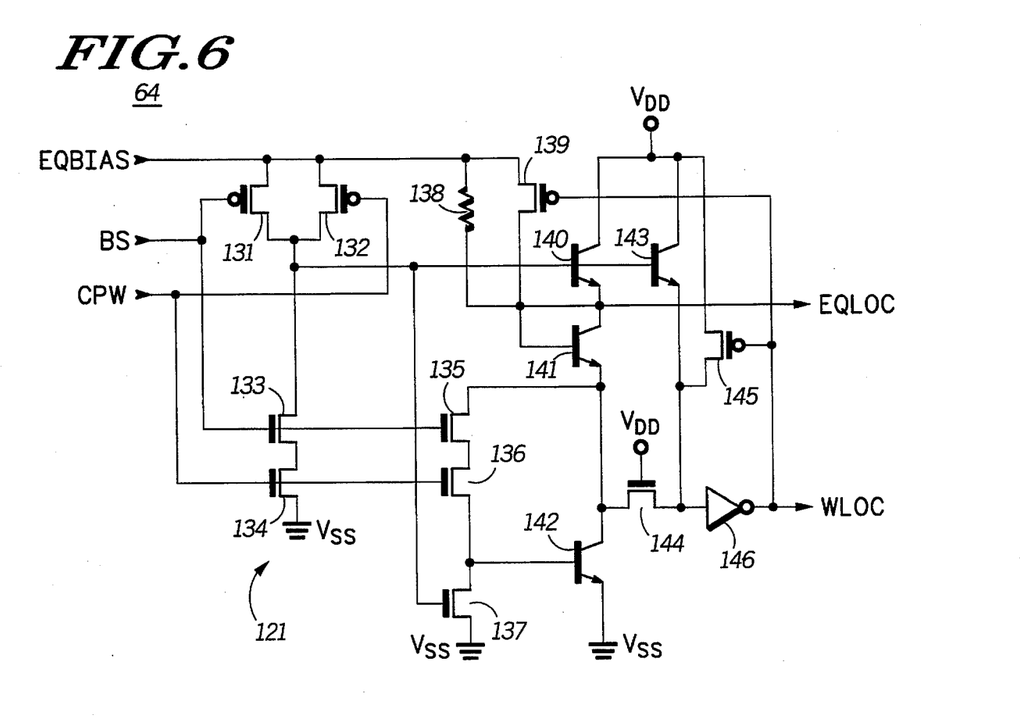
FIG. 6 illustrates in partial schematic form the bit line load control circuit of FIG. 3 for use with the bit line load of FIG. 4.

FIG. 6 illustrates in partial schematic form control signal generator circuit 64 for use with the bit line load of FIG. 4. Circuit 64 comprises a NAND gate 121, N-channel transistors 135, 136, and 137, a resistor 138, a P-channel transistor 139, NPN transistors 140, 141, 142, and 143, an N-channel transistor 144, a P-channel transistor 145, and an inverter 146. NAND gate 121 comprises P-channel transistors 131 and 132, and N-channel transistors 133 and 134.

Transistor 131 has a source connected to EQBIAS, a gate for receiving signal BS, and a drain providing an output terminal of NAND gate 121. Transistor 132 has a source connected to EQBIAS, a gate for receiving signal labelled "CPW", and a drain connected to the drain of transistor 131. Transistor 133 has a drain connected to the drain of transistor 131, a gate for receiving signal BS, and a source. Transistor 132 has a drain connected to the source of transistor 133, a gate for receiving signal CPW, and a source connected to $V_{SS}$. Transistor 135 has a drain, a gate for receiving signal BS, and a source. Transistor 136 has a drain connected to the source of transistor 135, a gate for receiving signal CPW, and a source. Transistor 137 has a drain connected to the source of transistor 136, a gate connected to the drain of transistor 131, and a source connected to $V_{SS}$. Resistor 138 has a first terminal connected to EQBIAS, and a second terminal for providing EQLOC. Transistor 139 has a source connected to EQBIAS, a gate for receiving signal WLOC, and a drain connected to the second terminal of resistor 138. Transistor 140 has a collector connected to $V_{DD}$, a base connected to the drain of transistor 131, and an emitter connected to the second terminal of resistor 138 and the drain of transistor 139. Transistor 141 has a collector connected to the emitter of transistor 140, a base connected to the second terminal of resistor 138 and to the drain of transistor 139, and an emitter connected to the drain of transistor 135. Transistor 142 has a collector connected to the emitter of transistor 141, a base connected to the drain of transistor 137, and an emitter connected to $V_{SS}$. Transistor 143 has a collector connected to $V_{DD}$, a base connected to the drain of transistor 131, and an emitter. Transistor 144 has a first current electrode connected to the emitter of transistor 141, a gate connected to $V_{DD}$, and a second current electrode connected to the emitter of transistor 143. Transistor 145 has a source connected to $V_{DD}$, a gate for receiving signal WLOC, and a drain connected to the emitter of transistor 143. Inverter 146 has an input terminal connected to the emitter of transistor 143, and an output terminal for providing signal WLOC.

Circuit 64 may be understood first by the logical relation established between the input signals, and then by the way the components shown in FIG. 6 perform the functions. BS is a signal asserted at a logic high when a block in which a corresponding bit line pair is located is enabled. CPW is a signal asserted at a logic high when a write to the corresponding bit line pairs occurs, and corresponds to one signal of the group CPW0–CPW7. EQLOC, provided on the emitter of transistor 140, is a logical NAND between signals BS and CPW. WLOC, on the other hand, is provided as an inverse of the logical NAND between CPW and BS; in other words, as a logical AND between BS and CPW. While WLOC is provided at CMOS levels, with a logic high of approximately $V_{DD}$ and a logic low of approximately $V_{SS}$, EQLOC is provided with a logic high of approximately EQBIAS, and a logic low of approximately $V_{SS}+2V_{BE}$. As described earlier, limitation of the logic low voltage of EQLOC improves the mean lifetime of transistors 103 and 104 of FIG. 4.

The output terminal of NAND gate 121 is provided by the drain of transistor 131. When the output terminal of NAND gate 121 is a logic high, the base-emitter junction of transistor 140 becomes forward biased to provide EQLOC as a logic high. When the output of NAND gate 121 is a logic high, either transistor 131 or transistor 132, or both, is conductive. Since both transistors 131 and 132 are P-channel transistors connected to voltage EQBIAS, at approximately 4.2 volts, a logic low voltage on the gates makes the transistors conductive. A drain-to-source voltage $V_{DS}$ of each transistor is approximately zero volts, and the voltage on the output terminal of NAND gate 121 is approximately at EQBIAS. Therefore, the logic high voltage of EQLOC is approximately EQBIAS. On the other hand, (EQBIAS– $V_{BE}$) appears on the input terminal of inverter 146 and is latched to $V_{DD}$ by transistor 145. This voltage is recognized as a logic high by inverter 146, and the output terminal of inverter 136 is driven to a logic low. Transistor 139 is placed into saturation, increasing EQLOC to EQBIAS. In essence, then, inverter 146 and transistor 139 form a weak latch to increase EQLOC to EQBIAS once EQLOC crosses from a logic low to a logic high. Transistor 137 is made conductive by the output of NAND gate 121, and couples the base of transistor 142 to $V_{SS}$, keeping the base-emitter junction of transistor 142 from becoming forward biased, and therefore keeping any current from flowing into the collector of transistor 141 or 142.

When the output terminal of NAND gate 121 is a logic low, caused by both BS and CPW being a logic high, EQLOC is provided at approximately ($V_{SS}$ +2$V_{BE}$). The base-emitter junction of transistor 140 becomes reverse biased, and transistor 139 becomes nonconductive. Transistors 135 and 136 both become conductive and couple the collector of transistor 142 to the base of transistor 142. Transistor 137 becomes nonconductive. Therefore, EQLOC is connected to $V_{SS}$ through two diode-connected transistors 141 and 142. Resistor 138 provides the bias current to keep the base-to-emitter diodes of transistors 141 and 142 forward biased.

With regard to WLOC, when the output of NAND gate 121 is a logic high, the voltage on the input terminal of inverter 146 is a logic high, and the output terminal of inverter 146 is a logic low. Transistor 145 then becomes conductive to provide a weak latch when the voltage at the input terminal of inverter 146 crosses from a logic low to logic high. When the output of NAND gate 121 switches to a logic low, transistor 143 becomes nonconductive. The high voltage developed on the input terminal of inverter 146 then causes transistor 144 to be conductive and to discharge the voltage on the input terminal of inverter 146 through transistor 142 to $V_{SS}$, until it passes below the switchpoint of inverter 146. It should be remembered that circuit 64 is but one embodiment for providing the waveforms shown in FIG. 5, and that other circuits are possible.

Figure 7:
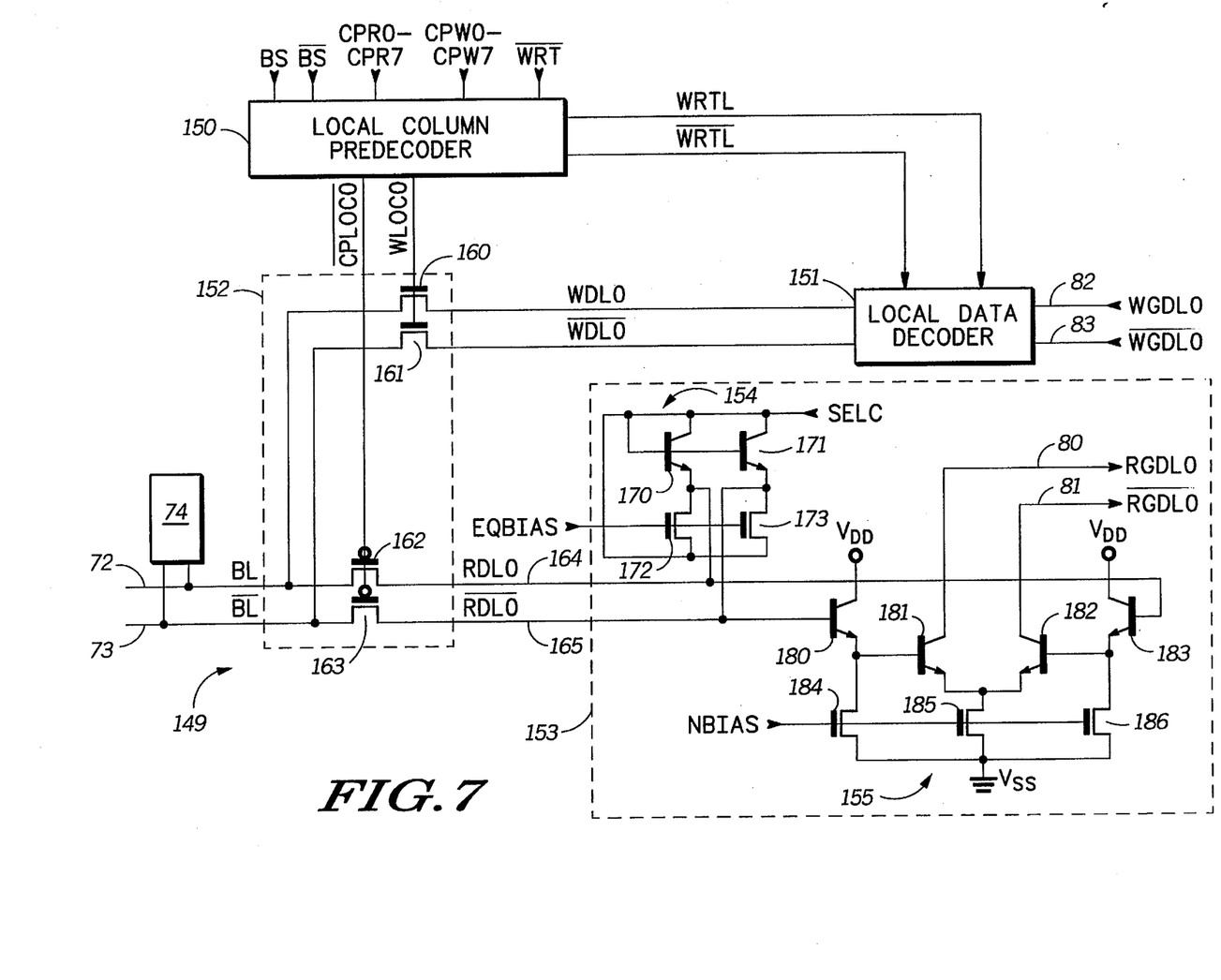
FIG. 7 illustrates in partial schematic and partial block form a portion of the column decoder of FIG. 3 including a sense circuit in accordance with the present invention.

FIG. 7 illustrates in partial schematic form and partial block form a portion 149 of column decoder 62 of FIG. 3 including a sense circuit 153 in accordance with the present invention. FIG. 7 generally shows bit lines 72 and 73 and bit line load 74 of FIG. 3, a local column predecoder 150, a local data decoder 151, a bit line column decoder 152, data line load 154, and sense amplifier 155. More particularly, bit line column decoder 152 comprises N-channel transistors 160 and 161, and P-channel transistors 162 and 163. Sense circuit 153 comprises a data line load 154 and a sense amplifier 155. Data line load 154 comprises NPN transistors 170 and 171, and N-channel transistors 172 and 173. Sense amplifier 155 comprises NPN transistors 180, 181, 182, and 183, and N-channel transistors 184, 185, and 186.

As in FIG. 3, and more particularly illustrated in FIG. 4, FIG. 7 also shows bit line load 74 coupled to bit lines 72 and 73. Local column predecoder 150 receives block select signal BS, a complement of signal BS labelled "$\overline{BS}$", predecoded column signals CPR0–CPR7, predecoded column signals CPW0–CPW7, and write signal $\overline{WRT}$. In response local column predecoder 150 provides a read predecoded signal labelled "$\overline{CPLOC0}$", a write predecoded signal labelled "WLOC0", and true and complement local write signals labelled respectively "WRTL" and "$\overline{WRTL}$". Local data decoder 151 receives write global data line signals WGDL0 and $\overline{WGDL0}$, and local write signals WRTL and $\overline{WRTL}$, and provides write data line signals labelled "WDL0" and "$\overline{WDL0}$" in response. In bit line column decoder 152, transistor 160 has a drain for receiving WDL0, a gate for receiving signal WLOC0, and a source connected to bit line 72. Note that the designation of source and drain is arbitrary since at different times either current electrode may be at a positive potential with respect to the other current electrode. Transistor 161 has a drain for receiving signal $\overline{WDL0}$, a gate for receiving signal WLOC0, and a source connected to bit line 73. Transistor 162 has a source connected to bit line 72, a gate for receiving signal $\overline{CPLOC0}$, and a drain for providing a signal labelled "RDL0" on a read data line 164. Transistor 163 has a source connected to bit line 73, a gate for receiving signal $\overline{CPLOC0}$, and a drain for providing a signal labelled "$\overline{RDL0}$" on a read data line 165.

In read data line load 154, transistor 170 has a collector for receiving a select signal labelled "SELC", a base for receiving signal SELC, and an emitter coupled to read data line 164. Transistor 171 has a collector for receiving signal SELC, a base for receiving signal SELC, and an emitter coupled to read data line 165. Transistor 172 has a drain for receiving signal SELC, a gate for receiving signal EQBIAS, and a source connected to the emitter of transistor 170 and to read data line 164. Transistor 173 has a drain for receiving signal SELC, a gate for receiving signal EQBIAS, and a source connected to the emitter of transistor 171 and to read data line 165. In sense amplifier 155, transistor 180 has a collector connected to $V_{DD}$, a base connected to read data line 165 for receiving signal $\overline{RDL0}$ thereon, and an emitter. Transistor 181 has a collector coupled to a read global data line 81 for providing signal $\overline{RGDL0}$ thereon, a base connected to the emitter of transistor 180, and an emitter.

Transistor 182 has a collector coupled to a read global data line 80 for providing signal RGDL0 thereon, a base, and an emitter connected to the emitter of transistor 181. Transistor 183 has a collector connected to $V_{DD}$, a base coupled to read data line 164 for receiving signal RDL0, and an emitter connected to the base of transistor 182. Transistor 184 has a drain connected to the emitter of transistor 180, a gate for receiving a bias signal labelled "NBIAS", and a source connected to $V_{SS}$. Transistor 185 has a drain connected to the emitters of transistors 181 and 182, a gate for receiving NBIAS, and a source connected to $V_{SS}$. Transistor 186 has a drain connected to the emitter of transistor 183, a gate for receiving NBIAS, and a source connected to $V_{SS}$.

In operation, portion 149 of column decoder 62 of FIG. 3 illustrated in FIG. 7 performs column decoding for read and write cycles, and data sensing during read cycles. In response to a write cycle to the corresponding memory block, indicated when both BS and $\overline{\text{WRT}}$ are asserted, local column predecoder 150 asserts WRTL and $\overline{\text{WRTL}}$. In response, local data decoder 151 couples write global data line signals WGDL0 and $\overline{\text{WGDL0}}$ respectively to WDL0 and $\overline{\text{WDL0}}$. Local column predecoder 150 provides eight predecoded signals, WLOC0 and seven others not shown in FIG. 7, to couple WDL0 and $\overline{\text{WDL0}}$ to one of eight bit line pairs. WLOC0 is an active-high signal which makes transistors 160 and 161 conductive to couple signals WDL0 and $\overline{\text{WDL0}}$ to bit lines 72 and 73 when asserted. WLOC0 is asserted in response to CPW0–CPW7 during the write cycle.

When the corresponding memory block is selected during the read cycle, local column predecoder 150 provides eight predecoded signals, $\overline{\text{CPLOC0}}$ and seven others not shown in FIG. 7, to couple one of eight bit line pairs to a corresponding read data line pair in response to CPR0–CPR7. $\overline{\text{CPLOC0}}$ is an active-low signal which makes transistors 162 and 163 conductive to couple bit lines 72 and 73 respectively to read data lines 164 and 165 when asserted. Seven other pairs of bit lines not shown are selectively coupled to read data lines 164 and 165 through P-channel transistors like transistors 162 and 163. A one-of-eight decode occurs on the eight bit line pairs to provide the one data line signal pair RDL0 and $\overline{\text{RDL0}}$ respectively on read data lines 164 and 165.

Read data line load 154 couples read data lines 164 and 165 to a logic low voltage of approximately $V_{SS}$ during the write cycle or when the corresponding memory block is not selected. When a read cycle to the corresponding memory block begins SELC is asserted at a logic high of (EQBIAS–$V_{BE}$). Bipolar transistors 170 and 171 quickly couple read data lines 164 and 165 to a predetermined voltage, the predetermined voltage equal to the select signal minus a $V_{BE}$ of transistor 170 or 171, or (SELC–$V_{BE}$). When the voltage on read data lines 164 and 165 exceeds (SELC–$V_{BE}$), the base-emitter junctions of bipolar transistors 170 and 171 are no longer forward biased and bipolar transistors 170 and 171 become inactive. Thereafter, the voltage on bit lines 72 and 73 continues to increase the voltage on read data lines 164 and 165, through transistors 162 and 163, until the voltage reaches approximately (EQBIAS–$V_{BE}$), as illustrated earlier in the discussion of FIGS. 4 and 5. After read data line load 154 becomes inactive, a differential voltage between read data lines 164 and 165 is determined by the contents of the selected memory cell. As described earlier in the discussion of FIGS. 4 and 5, the voltages provided on bit lines 72 and 73 are approximately (EQBIAS–$V_{BE}$), as determined by bit line load 74. Since the logic high of signal SELC is also approximately (EQBIAS–$V_{BE}$), the voltages of the bit lines and the read data lines are approximately equal.

The predetermined voltage provided on RDL0 and $\overline{\text{RDL0}}$ by read data line load 154 quickly enables sense amplifier 155. When the voltage on RDL0 and $\overline{\text{RDL0}}$ is at a logic low of SELC, approximately $V_{SS}$, amplifier 155 is disabled. However, in response to the start of the read cycle, sense amplifier 155 is enabled and senses a differential voltage between bit lines 72 and 73 determined by the bit stored in the selected memory cell. The differential voltage sensed by sense amplifier 155 is provided as a differential current on global data lines 80 and 81. Then, as previously illustrated in FIG. 2, combined global data line loads and multiplexer 37 converts the differential current into a differential voltage for eventual output as signal group DATA.

More particularly, sense amplifier 155 is enabled when the voltage on either read data line 164 or 165 exceeds a predetermined voltage of approximately ($V_{SS}$+2$V_{BE}$). When the corresponding memory block is not selected during the read cycle, SELC is negated and transistors 172 and 173 are conductive, coupling data lines 172 and 173 to SELC at approximately $V_{SS}$. Since transistors 180 and 181 are emitter followers, the voltage on the emitter of transistor 181 follows the voltage on the base of transistor 180 but at 2$V_{BE}$ below. As the voltage on read data line 165 drops toward $V_{SS}$, the voltage on the emitter of transistor 181 drops. When the voltage on the base of transistor 181 reaches zero, transistor 181 is no longer in the active region. Hence substantially no current is drawn from read global data line 81. Similarly, because the voltage on read data line 164 also approaches the logic low voltage of approximately $V_{SS}$, transistor 182 is no longer in the active region and substantially no current is drawn from read global data line 80. Hence, when SELC is negated, sense amplifier 155 is disabled.

When SELC is asserted, the voltages on the emitters of transistors 170 and 171 rise to approximately (SELC–$V_{BE}$), which is equal to (EQBIAS–2$V_{BE}$), before eventually rising to SELC. The voltages on the emitters of transistors 180 and 183 follow the voltages on read data lines 165 and 164, respectively, minus one $V_{BE}$. The selected memory cell provides a differential signal between BL and $\overline{\text{BL}}$, which is reflected as a differential voltage between the voltage on the bases of transistor 182 and 181. The voltage difference causes transistors 182 and 181 to be more or less conductive with respect to each other, and hence to selectively divert the current sourced by transistor 185 in response to the voltage difference. NBIAS is a voltage which is generated on-chip and which biases N-channel MOS transistors to function as current sources. Transistors 182 and 181 are in the active region, and a small difference in voltage is reflected in a large difference in output current on read global data lines 80 and 81. Sense amplifier 155 is thus a transconductance amplifier, converting a differential voltage into a differential current. Subsequently, combined global data line loads and multiplexer 37 of FIG. 2 convert the differential current provided on read global data lines 80 and 81 into a differential voltage for final sensing and outputting. Read data line load 154 couples read data lines 164 and 165 to a voltage high enough to enable sense amplifier 155 through bipolar transistors 170 and 171, which switch faster than corresponding MOS transistors. Then read data line load 154 becomes inactive. Thus, sense circuit 153 improves the speed of the sensing function over the speed which could be accomplished with a MOS design, while keeping power consumption to a minimum.

Figure 8:
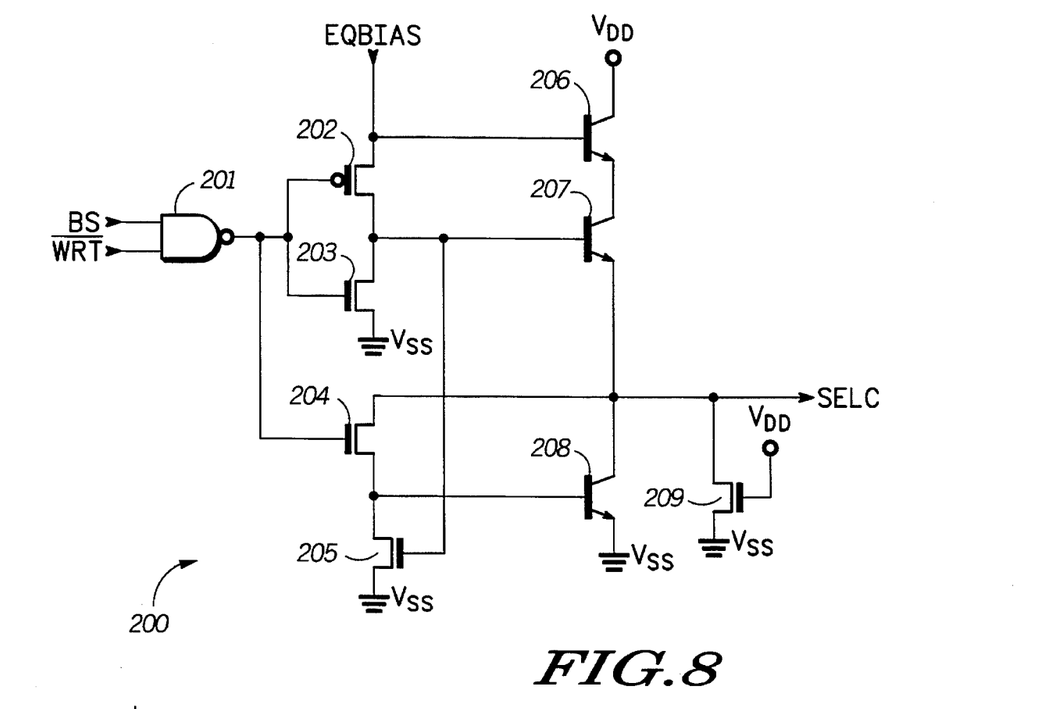
FIG. 8 illustrates in partial schematic form a control circuit used to generate a control signal for the data line load of FIG. 7.

FIG. 8 illustrates in partial schematic form a control circuit 200 used to generate a control signal for data line load 154 of FIG. 7. Control circuit 200 is one circuit which can be used to generate signal SELC with the proper logic levels and with the proper relation to signals BS and $\overline{WRT}$, but others may also be used. Control circuit 200 comprises a NAND gate 201, a P-channel transistor 202, N-channel transistors 203, 204, and 205, NPN transistors 206, 207, and 208, and an N-channel transistor 209. NAND gate 201 has a first input terminal for receiving signal BS, a second input terminal for receiving signal $\overline{WRT}$, and an output terminal. Transistor 202 has a source for receiving signal EQBIAS, a gate connected to the output terminal of NAND gate 201, and a drain. Transistor 203 has a drain connected to the drain of transistor 202, a gate connected to the output terminal of NAND gate 201, and a source connected to $V_{SS}$. Transistor 204 has a drain, a gate connected to the output terminal of NAND gate 201, and a source. Transistor 205 has a drain connected to the source of transistor 204, a gate connected to the drain of transistor 202, and a source connected to $V_{SS}$. Transistor 206 has a collector connected to $V_{SS}$, a base for receiving signal EQBIAS, and an emitter. Transistor 207 has a collector connected to the emitter of transistor 206, a base connected to the drain of transistor 202, and an emitter for providing signal SELC. Transistor 208 has a collector connected to the emitter of transistor 207 and to the drain of transistor 204, a base connected to the source of transistor 204, and an emitter connected to $V_{SS}$. Transistor 209 has a drain connected to the emitter of transistor 207, a gate connected to $V_{DD}$, and a source connected to $V_{SS}$.

In operation, control circuit 200 provides signal SELC at a logic high in response to signal BS being asserted and $\overline{WRT}$ being negated, or in other words, when a corresponding memory block is selected during a read cycle. In that case, the output of NAND gate 201 is a logic low. Transistors 202 and 203 logically function as an inverter, and the voltage on the drain of transistor 202 is a logic high of approximately EQBIAS. Transistor 204 is nonconductive, and transistor 205 is conductive, coupling the base of transistor 208 to $V_{SS}$ to prevent it from being conductive. At the same time, transistor 207 is made conductive by the application of approximately EQBIAS to the base. The voltage of SELC then is one base-to-emitter diode voltage drop below the voltage of the base, or approximately (EQBIAS–$V_{BE}$). The emitter of transistor 206 is coupled to the collector of transistor 207 to provide a voltage less than either $V_{DD}$ or EQBIAS. The emitter of transistor 206 is set at a voltage of (EQBIAS–$V_{BE}$). When the voltage on the base of transistor 207 is a logic high at approximately EQBIAS, the reduced voltage on the collector of transistor 207 makes transistor 207 begin to saturate as the voltage on the base approaches EQBIAS, to prevent self-boosting of the base of transistor 206. When the corresponding memory block is not selected or a write cycle is in progress (BS or $\overline{WRT}$ at a logic low), the output of NAND gate 201 is at a logic high, making transistor 204 conductive, which couples together the collector and the emitter of transistor 204 to provide SELC at a logic low. The voltage on the drain of transistor 202 is a logic low, and transistor 207 is nonconductive. Transistor 209, which is always conductive, is provided as a weak pulldown to SELC to decrease the voltage on SELC to $V_{SS}$ when SELC is provided as a logic low. Using typical values, SELC has a logic high voltage of approximately (EQBIAS–$V_{BE}$), or 3.5 volts, and a logic low voltage of approximately $V_{SS}$, or 0 volts. The predetermined voltage at which point sense amplifier 155 becomes active is equal to approximately ($V_{SS}$+2$V_{BE}$), or about 1.4 volts.

Figure 9:
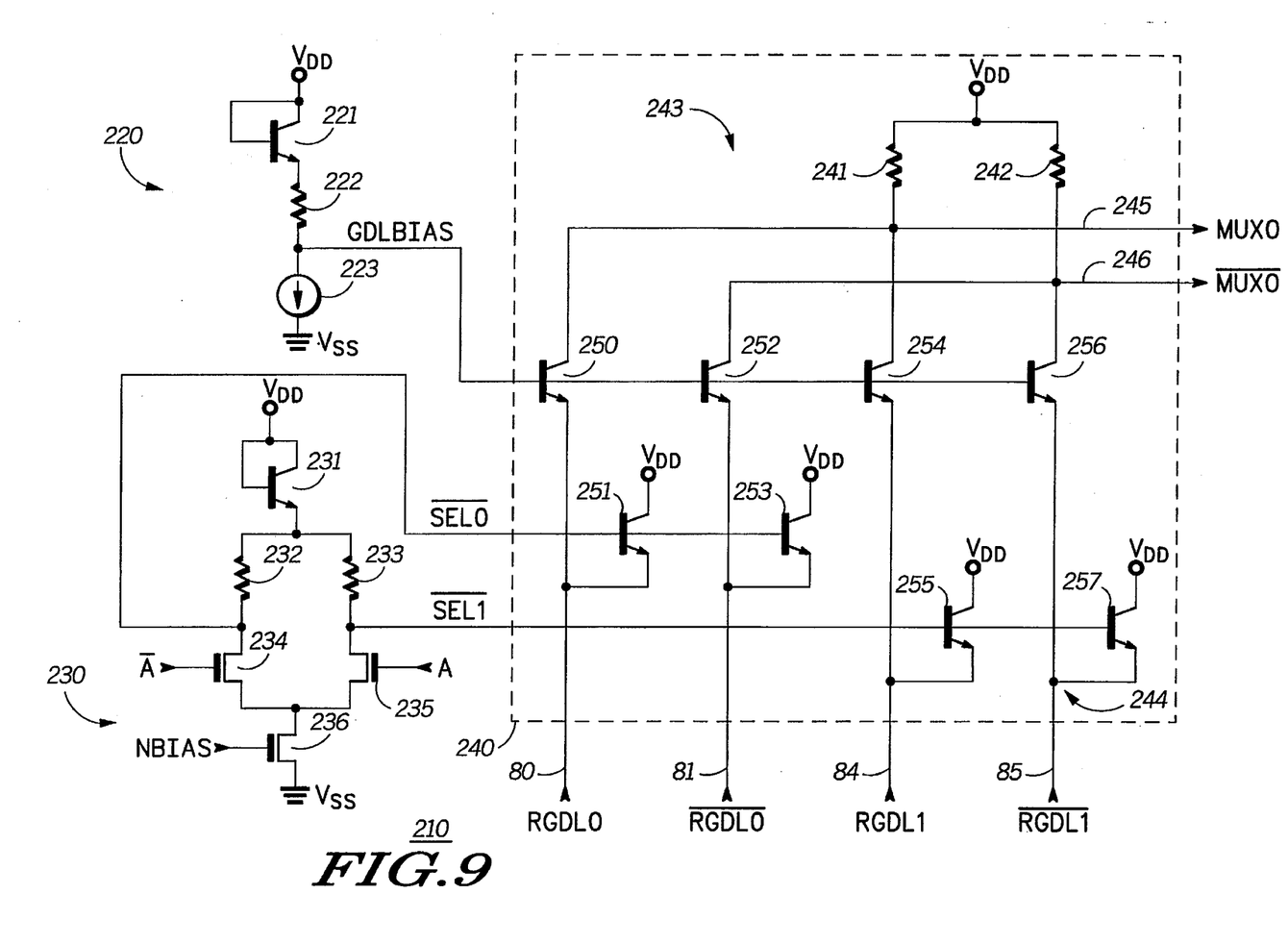
FIG. 9 is a partial schematic diagram of a portion of the combined global data line load and multiplexer of FIG. 2.

FIG. 9 is a partial schematic diagram of a portion 210 of combined global data line loads and multiplexer 37 of FIG. 2. Portion 210 is coupled to read global data lines 80 and 81 which respectively conduct signals RGDL0 and $\overline{RGDL0}$, as shown in FIG. 3. In addition portion 210 is coupled to a read global data line 84 and a read global data line 85. Read global data lines 84 and 85 respectively conduct signals RGDL1 and $\overline{RGDL1}$, previously shown as part of the signal group RGDL0–RGDL7/$\overline{RGDL0}$–$\overline{RGDL7}$ of FIG. 2. Portion 210 comprises generally a bias generator circuit 220, a decoder 230, and a global data line load/multiplexer portion 240. Bias generator circuit 220 comprises an NPN transistor 221, a resistor 222, and a current source 223. Decoder 230 comprises an NPN transistor 231, resistors 232 and 233, and N-channel transistors 234, 235, and 236. Global data line load/multiplexer portion 240 comprises resistors 241 and 242, and switching portions 243 and 244. Switching portion 243 comprises NPN transistors 250, 251, 252, and 253. Switching portion 244 comprises NPN transistors 254, 255, 256, and 257.

In bias generator circuit 220, transistor 221 has a collector connected to $V_{DD}$, a base connected to $V_{DD}$, and an emitter. Resistor 222 has a first terminal connected to the emitter of transistor 221, and a second terminal for providing a bias signal labelled "GDLBIAS". In decoder 230, transistor 231 has a collector connected to $V_{DD}$, a base connected to $V_{DD}$, and an emitter. Resistor 232 has a first terminal connected to the emitter of transistor 231, and a second terminal for providing signal $\overline{SEL0}$. Resistor 233 has a first terminal connected to the emitter of transistor 231, and a second terminal for providing signal $\overline{SEL1}$. Transistor 234 has a drain connected to the second terminal of resistor 232, a gate for receiving signal $\overline{A}$, and a source. Transistor 235 has a drain connected to the second terminal of resistor 233, a gate for receiving signal A, and a source connected to the source of transistor 234. Transistor 236 has a drain connected to the sources of transistors 234 and 235, a gate for receiving bias signal NBIAS, and a source connected to $V_{SS}$.

In switching portion 243 of global data line load/multiplexer portion 240, resistor 241 has a first terminal connected to $V_{DD}$, and a second terminal for providing MUX0 on a signal line 245. Resistor 242 has a first terminal connected to $V_{DD}$, and a second terminal for providing $\overline{MUX0}$ on a signal line 246. Transistor 250 has a collector connected to the second terminal of resistor 241, a base for receiving signal GDLBIAS, and an emitter coupled to read global data line 80. Transistor 251 has a collector connected to $V_{DD}$, a base for receiving signal $\overline{SEL0}$, and an emitter connected to read global data line 80. Transistor 252 has a collector connected to the second terminal of resistor 242, a base for receiving signal GDLBIAS, and an emitter coupled to read global data line 81. Transistor 253 has a collector connected to $V_{DD}$, a base for receiving signal $\overline{SEL0}$, and an emitter connected to read global data line 81. Transistor 254 has a collector connected to the second terminal of resistor 241, a base for receiving signal GDLBIAS, and an emitter coupled to read global data line 84. Transistor 255 has a collector connected to $V_{DD}$, a base for receiving signal $\overline{SEL1}$, and an emitter connected to read global data line 84. Transistor 256 has a collector connected to the second terminal of resistor 242, a base for receiving signal GDLBIAS, and an emitter coupled to read global data line 85. Transistor 257 has a collector connected to $V_{DD}$, a base for receiving signal $\overline{SEL1}$, and an emitter connected to read global data line 85.

Portion 210 shows two read global data line pairs, 80/81 and 84/85 for carrying signal pairs RGDL0/$\overline{RGDL0}$ and RGDL1/$\overline{RGDL1}$ and multiplexed to provide one signal pair MUX0 and $\overline{MUX0}$ in response to an input address bit A and its complement $\overline{A}$. In the embodiment illustrated in FIG. 2, memory 30 is a X4 memory. The eight read global data line pairs RGDL0–RGDL7/$\overline{\text{RGDL0}}$–$\overline{\text{RGDL7}}$ are multiplexed into four signal pairs MUX0–MUX3/$\overline{\text{MUX0}}$–$\overline{\text{MUX3}}$. Note that three additional global data line load/multiplexers providing signals MUX1–MUX3/$\overline{\text{MUX1}}$–$\overline{\text{MUX3}}$ are not shown in FIG. 9 but are structurally identical to global data line load/multiplexer 240 which is shown in FIG. 9. Specifically, a second global data line load/multiplexer providing output signals MUX1/$\overline{\text{MUX1}}$, not shown in FIG. 9, corresponds to RGDL2/$\overline{\text{RGDL2}}$ and RGDL3/$\overline{\text{RGDL3}}$. A third global data line load/multiplexer and providing output signals MUX2 and $\overline{\text{MUX2}}$, not shown in FIG. 9, corresponds to RGDL4/$\overline{\text{RGDL4}}$ and RGDL5/$\overline{\text{RGDL5}}$. A fourth global data line load/multiplexer providing output signals MUX3 and $\overline{\text{MUX3}}$, not shown in FIG. 9, corresponds to RGDL6/$\overline{\text{RGDL6}}$ and RGDL7/$\overline{\text{RGDL7}}$.

Decoder 230 provides two signals, $\overline{\text{SEL0}}$ and $\overline{\text{SEL1}}$, in response to an input address signal A and its complement $\overline{\text{A}}$. $\overline{\text{SEL0}}$ is asserted at a logic low in response to input address bit A being in a first predetermined state, namely a logic low. $\overline{\text{SEL1}}$ is asserted at a logic low in response to input address bit A being in a second predetermined state, namely a logic high. Transistor 231 ensures that a logic high voltage is equal to ($V_{DD}$–$V_{BE}$).

If A is asserted at a logic high (and $\overline{\text{A}}$ is asserted as a logic low), then transistor 235 is conductive, and $\overline{\text{SEL1}}$ is asserted. The logic low voltage of $\overline{\text{SEL1}}$ is determined by the size of transistor 236 and the value of resistor 233. $\overline{\text{SEL0}}$ is negated at a logic high which, as indicated earlier, is equal to ($V_{DD}$–$V_{BE}$). If $\overline{\text{A}}$ is negated at a logic low (and A is negated at a logic high), then $\overline{\text{SEL0}}$ is asserted and $\overline{\text{SEL1}}$ is negated. If the gate sizes of transistors 234 and 235 are equal, and if the values of resistors 232 and 233 are equal, then the logic high voltage of $\overline{\text{SEL0}}$ will equal the logic high voltage of $\overline{\text{SEL1}}$, and the logic low voltage of $\overline{\text{SEL0}}$ will equal the logic low voltage of $\overline{\text{SEL1}}$.

Bias generator circuit 220 provides voltage bias signal GDLBIAS to bias bipolar transistors in global data line load/multiplexer portion 240. In the illustrated embodiment, the value of resistors 232 and 233 are equal. Let $I_{223}$ equal the current of current source 223, and $I_{236}$ be the current sourced by transistor 236; and $R_{222}$ equal the resistance of resistor 222 and $R_{232}$ equal the resistance of resistor 232 (or 233). For any emitter-coupled transistor pair in global data line load/multiplexer portion 240 to switch current, $$I_{236}R_{232} > I_{223}R_{222} \qquad (3)$$

where an emitter coupled pair is, for example, transistors 250 and 251. GDLBIAS is thus a voltage between the logic high and the logic low voltage of $\overline{\text{SEL0}}$ and $\overline{\text{SEL1}}$.

Each emitter coupled pair of transistors operates as a current switch controlled by GDLBIAS and a corresponding select signal. Thus if $\overline{\text{SEL0}}$ is a logic low, then transistors 251 and 253 are less conductive than transistors 250 and 252, and thus substantially all the current sourced through global data lines 80 and 81 is conducted through transistors 250 and 252, respectively. The voltages of MUX0 and $\overline{\text{MUX0}}$ are approximately equal to power supply voltage $V_{DD}$ minus the currents on read global data lines 80 and 81 times the values of resistors 241 and 242, respectively. Thus a differential voltage between signals MUX0 and $\overline{\text{MUX0}}$ is provided proportional to a differential current provided on read global data lines 80 and 81, when the corresponding select signal $\overline{\text{SEL0}}$ is less than GDLBIAS. When $\overline{\text{SEL0}}$ is a logic low, $\overline{\text{SEL1}}$ is a logic high. Since the logic high voltage of $\overline{\text{SEL1}}$ is greater than GDLBIAS, transistors 255 and 257 are substantially more conductive than transistors 254 and 256, and thus the differential current on read global data lines 84 and 85 substantially flows through transistors 255 and 257 to $V_{DD}$. The differential current of read global data lines 84 and 85 leaves the voltages of MUX0 and $\overline{\text{MUX0}}$ substantially unaffected in this case.

The correspondence between the global data lines, multiplexed output signal lines, and select signals should be noted. In the illustrated embodiment, eight global data line pairs are multiplexed into four output signal line pairs. An extra address bit A selects between even and odd read global data line pairs of groups of two consecutive global data line pairs. $\overline{\text{SEL0}}$ thus corresponds to read global data line pairs RGDL0/$\overline{\text{RGDL0}}$, RGDL2/$\overline{\text{RGDL2}}$, RGDL4/$\overline{\text{RGDL4}}$, and RGDL6/$\overline{\text{RGDL6}}$, and $\overline{\text{SEL1}}$ corresponds to read global data line pairs RGDL1/$\overline{\text{RGDL1}}$, RGDL3/$\overline{\text{RGDL3}}$, RGDL5/$\overline{\text{RGDL5}}$, and RGDL7/$\overline{\text{RGDL7}}$. In an alternative embodiment, eight global data line pairs are multiplexed to a single output data line pair in a X1 memory. In the X1 memory, three additional address bits are necessary to provide a one-of-eight decode. A decoder for the X1 memory receives the three extra address bits and provides eight select signals each corresponding to a different state of the three extra address bits. The global data line load/multiplexer portion comprises eight switching portions. However each switching portion is coupled to the single output signal line pair. As before, the output signal line pair is coupled to $V_{DD}$ through two resistors. Note also that transistor types may be varied. For example, in an embodiment in which bipolar transistors are not available, MOS transistors may be used instead of transistors 250–257. In this embodiment, bipolar transistors 221 and 231 may not be needed, and select signals provided by decoder 230 are provided at substantially CMOS logic levels.

It should be apparent by now that a combined global data line load and multiplexer which reduces circuitry and thus improves speed in multiplexed memories has been described. The combined global data line load and multiplexer was described by showing a portion 210 of combined global data line loads and multiplexer block 37 comprising a bias portion 220, a decoder 230, and a global data line load/multiplexer portion 240. The global data line load/multiplexer portion 240 comprises a plurality of switching portions such as switching portions 243 and 244 shown in FIG. 9. Decoder 230 provides a plurality of select signals ($\overline{\text{SEL0}}$ and $\overline{\text{SEL1}}$) in response to a portion of an address (A) being respectively in each of a plurality of logic states (logic low and logic high, respectively). The bias portion provides a bias signal (GDLBIAS) at a voltage between a logic high and a logic low voltage of each of the plurality of select signals ($\overline{\text{SEL0}}$ and $\overline{\text{SEL1}}$). Each switching portion (243 or 244) in global data line load/multiplexer portion 240 is coupled to first and second output signal lines (245 and 246) of a corresponding output signal line pair (MUX0/$\overline{\text{MUX0}}$) and provides substantially the differential current between global data lines 80 and 81 onto first and second output signal lines 245 and 246, respectively, in response to bias voltage GDLBIAS exceeding a voltage of a corresponding select signal ($\overline{\text{SEL0}}$ for switching portion 243 and $\overline{\text{SEL1}}$ for switching portion 244).

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A memory comprising:

a plurality of memory cells coupled to corresponding ones of a plurality of bit line pairs, each of said plurality of memory cells comprising at least one field effect transistor;

first decoding means coupled to said plurality of memory cells, for selecting a memory cell coupled to each of said plurality of bit line pairs in response to a first portion of an address;

second decoding means coupled to said plurality of bit line pairs, for selecting first and second bit line pairs in response to a second portion of said address;

global data line means coupled to said second decoding means, for providing first and second differential currents respectively to each of first and second global data line pairs in response to a data bit stored in first and second selected memory cells coupled to said first and second bit line pairs, respectively;

third decoding means, for providing first and second select signals in response to a third portion of said address;

a combined global data line load and multiplexer coupled to said first and second global data line pairs, comprising:

first and second resistors having first terminals coupled to a first power supply voltage terminal, and having second terminals respectively coupled to first and second output lines;

a first transistor having a collector coupled to said first output line, a base for receiving a bias signal, and an emitter coupled to a true global data line of said first global data line pair;

a second transistor having a collector coupled to said second output line, a base for receiving said bias signal, and an emitter coupled to a complement global data line of said first global data line pair;

a third transistor having a collector coupled to said first output line, a base for receiving said bias signal, and an emitter coupled to a true global data line of said second global data line pair;

a fourth transistor having a collector coupled to said second output line, a base for receiving said bias signal, and an emitter coupled to a complement global data line of said second global data line pair;

a fifth transistor having a collector coupled to said first power supply voltage terminal, a base for receiving said first select signal, and an emitter coupled to said true global data line of said first global data line pair;

a sixth transistor having a collector coupled to said first power supply voltage terminal, a base for receiving said first select signal, and an emitter coupled to said complement global data line of said first global data line pair;

a seventh transistor having a collector coupled to said first power supply voltage terminal, a base for receiving said second select signal, and an emitter coupled to said true global data line of said second global data line pair; and an eighth transistor having a collector coupled to said first power supply voltage terminal, a base for receiving said second select signal, and an emitter coupled to said complement global data line of said second global data line pair.

2. The memory of claim 1 wherein said combined global data line load and multiplexer further comprises bias means coupled to said first, second, third, and fourth transistors, for providing said bias signal at a voltage between a logic high and a logic low voltage of said first and second select signals.

3. The memory of claim 2 wherein said bias means comprises:

a ninth transistor having a collector coupled to said first power supply voltage terminal, a base coupled to said first power supply voltage terminal, and an emitter;

a third resistor, having a first terminal coupled to said emitter of said ninth transistor, and a second terminal for providing said bias signal; and a current source coupled to said second terminal of said third resistor, for providing a predetermined current to a second power supply voltage terminal.

4. The memory of claim 2 wherein said third decoding means comprises:

a ninth transistor having a collector coupled to said first power supply voltage terminal, a base coupled to said first power supply voltage terminal, and an emitter;

a third resistor, having a first terminal coupled to said emitter of said ninth transistor, and a second terminal for providing said first select signal;

a fourth resistor, having a first terminal coupled to said emitter of said ninth transistor, and a second terminal for providing said second select signal;

a first MOS transistor having a first current electrode coupled to said second terminal of said third resistor, a control electrode for receiving a complement of an address input signal, and a second current electrode;

a second MOS transistor having a first current electrode coupled to said second terminal of said fourth resistor, a control electrode for receiving said address input signal, and a second current electrode coupled to said second current electrode of said first MOS transistor; and a current source coupled to said second current electrode of each of said first and second MOS transistors and to a second power supply voltage terminal, for providing a second predetermined current.

5. A memory comprising:

a plurality of memory blocks, each including a plurality of memory cells, each of said plurality of memory cells comprising at least one field effect transistor;

first decoding means coupled to said plurality of memory blocks, for selecting a plurality of memory cells from a selected one of said plurality of memory blocks in response to a first portion of an address;

second decoding means coupled to said plurality of memory blocks, for selecting first and second memory cells from said selected one of said plurality of memory blocks in response to a second portion of said address;

global data line means coupled to said second decoding means, for providing first and second differential currents respectively to each of first and second global data line pairs in response to a data bit stored in each of said first and second selected memory cells;

a combined global data line load and multiplexer, comprising:

third decoding means, for providing first and second select signals in response to a second portion of said address, said first and second select signals provided at either a logic high voltage or a logic low voltage;

bias means for providing a bias signal at a voltage between said logic high and said logic low voltages;

an output signal line pair, first and second output signal lines of said output signal line pair respectively coupled through first and second resistors to a power supply voltage terminal;

first switching means coupled to said first global data line pair and to said output signal line pair, for providing a first differential current on said output signal line pair proportional to a differential current on said first global data line pair in response to said voltage of said bias signal, exceeding a voltage of said first select signal; and second switching means coupled to said second global data line pair and to said output signal line pair, for providing a second differential current on said output signal line pair proportional to a differential current on said second global data line pair in response to said voltage of said bias signal exceeding a voltage of said second select signal.

wherein said first and second switching means each comprises:
  a first transistor having a first current electrode coupled to a first output signal line of said output signal line pair, a control electrode for receiving said bias signal, and a second current electrode coupled to a first global data line of a corresponding global data line pair;
  a second transistor having a first current electrode coupled to said power supply voltage terminal, a control electrode for receiving a corresponding select signal, and a second current electrode coupled to said second current electrode of said first transistor;
  a third transistor having a first current electrode coupled to a second output signal line of said output signal line pair, a control electrode for receiving said bias signal, and a second current electrode coupled to a second global data line of said corresponding global data line pair; and
  a fourth transistor having a first current electrode coupled to said power supply voltage terminal, a control electrode for receiving said corresponding select signal, and a second current electrode coupled to said second current electrode of said third transistor.

6. The memory of claim 5, wherein said first, second, third, and fourth transistors are bipolar transistors.

7. A memory comprising:
  a plurality of memory blocks, each including:
    a plurality of memory cells located at intersections of a plurality of word lines and a plurality of bit line pairs, each of said plurality of memory cells comprising at least one field effect transistor;
    row decoding means for enabling one word line of said plurality of word lines when said memory block is selected;
    column decoding means, for coupling a plurality of bit line pairs selected by a column address to a corresponding plurality of data line pairs; and
    a plurality of sense amplifiers corresponding to said plurality of data line pairs, for sensing a voltage difference between said data line pairs and providing a differential current to a corresponding plurality of global data line pairs in response;
  block decoding means coupled to said plurality of memory blocks, for selecting a memory block of said plurality of memory blocks in response to a block address; and a combined global data line load and multiplexer, comprising:
  means for providing first and second select signals in response to a portion of an address, said first and second select signals provided at either a logic high voltage or a logic low voltage;
  bias means for providing a bias signal at a voltage between said logic high and said logic low voltages;
  an output signal line pair, first and second output signal lines of said output signal line pair respectively coupled through first and second resistors to a power supply voltage terminal;
  first switching means coupled to a first global data line pair and to said output signal line pair, for providing a first differential current on said output signal line pair proportional to a differential current on said first global data line pair in response to said voltage of said bias signal exceeding a voltage of said first select signal; and
  second switching means coupled to a second global data line pair and to said output signal line pair, for providing a second differential current on said output signal line pair proportional to a differential current on said second global data line pair in response to said voltage of said bias signal exceeding a voltage of said second select signal wherein said first and second switching means each comprises:
  a first transistor having a first current electrode coupled to a first output signal line of said output signal line pair, a control electrode for receiving said bias signal, and a second current electrode coupled to a first global data line of a corresponding global data line pair;
  a second transistor having a first current electrode coupled to said power supply voltage terminal, a control electrode for receiving a corresponding select signal, and a second current electrode coupled to said second current electrode of said first transistor;
  a third transistor having a first current electrode coupled to a second output signal line of said output signal line pair, a control electrode for receiving said bias signal, and a second current electrode coupled to a second global data line of said corresponding global data line pair; and
  a fourth transistor having a first current electrode coupled to said power supply voltage terminal, a control electrode for receiving said corresponding select signal, and a second current electrode coupled to said second current electrode of said third transistor.

8. The memory of claim 7, wherein said first, second, third, and fourth transistors are bipolar transistors.

9. A memory comprising:
  a memory array including a predetermined number of memory cells;
  decoding means coupled to said memory array, for selecting a plurality of selected memory cells in said memory array in response to a first portion of an address;
  a plurality of read global data line pairs for conducting output data during a read cycle;
  a plurality of sense amplifiers coupled to said decoding means and to said plurality of read global data line pairs, for providing a differential current to said plurality of read global data line pairs in response to data stored in said selected memory cells during said read cycle; and a plurality of write global data line pairs coupled to said decoding means, for conducting input data during a write cycle;

a combined global data line load and multiplexer coupled to said plurality of read global data line pairs, comprising:

means for providing first and second select signals in response to a second portion of said address, said first and second select signals provided at either a logic high voltage or a logic low voltage;

bias means for providing a bias signal at a voltage between said logic high and said logic low voltages;

an output signal line pair, first and second output signal lines of said output signal line pair respectively coupled through first and second resistors to a power supply voltage terminal;

first switching means coupled to a first read global data line pair of said plurality of read global data line pairs and to said output signal line pair, for providing a first differential current on said output signal line pair proportional to a differential current on said first read global data line pair in response to said voltage of said bias signal exceeding a voltage of said first select signal; and second switching means coupled to a second read global data line pair of said plurality of read global data line pairs and to said output signal line pair, for providing a second differential current on said output signal line pair proportional to a differential current on said second read global data line pair in response to said voltage of said bias signal exceeding a voltage of said second select signal wherein said first and second switching means each comprises:

a first transistor having a first current electrode coupled to a first output signal line of said output signal line pair, a control electrode for receiving said bias signal, and a second current electrode coupled to a first global data line of a corresponding read global data line pair;

a second transistor having a first current electrode coupled to said power supply voltage terminal, a control electrode for receiving a corresponding select signal, and a second current electrode coupled to said second current electrode of said first transistor;

a third transistor having a first current electrode coupled to a second output signal line of said output signal line pair, a control electrode for receiving said bias signal, and a second current electrode coupled to a second read global data line of said corresponding read global data line pair; and a fourth transistor having a first current electrode coupled to said power supply voltage terminal, a control electrode for receiving said corresponding select signal, and a second current electrode coupled to said second current electrode of said third transistor.

10. The memory of claim 9, wherein said first, second, third, and fourth transistors are bipolar transistors.

11. The memory of claim 9, wherein each of said memory cells includes at least one field effect transistor coupled to a corresponding bit line.

* * * * *